(12) United States Patent
Nishimoto et al.

(10) Patent No.: US 9,693,449 B2
(45) Date of Patent: Jun. 27, 2017

(54) POWER MODULE SUBSTRATE, POWER MODULE SUBSTRATE WITH METAL PART, POWER MODULE WITH METAL PART, METHOD FOR PRODUCING POWER MODULE SUBSTRATE, AND METHOD FOR PRODUCING POWER MODULE SUBSTRATE WITH METAL PART

(71) Applicant: MITSUBISHI MATERIALS CORPORATION, Tokyo (JP)

(72) Inventors: Shuji Nishimoto, Ageo (JP); Yoshiyuki Nagatomo, Saitama (JP)

(73) Assignee: Mitsubishi Materials Corporation, Tokyo (JP)

(*) Notice: Subject to any disclaimer, the term of this patent is extended or adjusted under 35 U.S.C. 154(b) by 54 days.

(21) Appl. No.: 14/655,488

(22) PCT Filed: Dec. 20, 2013

(86) PCT No.: PCT/JP2013/084373
§ 371 (c)(1),
(2) Date: Jun. 25, 2015

(87) PCT Pub. No.: WO2014/103965
PCT Pub. Date: Jul. 3, 2014

(65) Prior Publication Data
US 2016/0219693 A1    Jul. 28, 2016

(30) Foreign Application Priority Data
Dec. 27, 2012  (JP) ................................. 2012-284641

(51) Int. Cl.
*H05K 1/00* (2006.01)
*H05K 1/02* (2006.01)
(Continued)

(52) U.S. Cl.
CPC ......... *H05K 1/0271* (2013.01); *C04B 37/021* (2013.01); *H01L 23/3735* (2013.01);
(Continued)

(58) Field of Classification Search
CPC .... H05K 1/0271; H05K 3/465; H05K 1/0203; H05K 1/0204; H05K 2201/09472; H05K 3/38
See application file for complete search history.

(56) References Cited

U.S. PATENT DOCUMENTS

| | | | |
|---|---|---|---|
| 6,309,737 B1 * | 10/2001 | Hirashima | C04B 37/026 174/258 |
| 2007/0274047 A1 * | 11/2007 | Nagase | H01L 23/3735 361/704 |
| 2007/0297162 A1 | 12/2007 | Negishi et al. | |
| 2011/0070695 A1 * | 3/2011 | Bayerer | H01L 24/49 438/107 |

(Continued)

FOREIGN PATENT DOCUMENTS

| | | |
|---|---|---|
| JP | 2008-016813 A | 1/2008 |
| JP | 2009-135392 A | 6/2009 |

(Continued)

OTHER PUBLICATIONS

English translation Mitsubishi Materials JP2010-287554.*
(Continued)

*Primary Examiner* — Steven T Sawyer
(74) *Attorney, Agent, or Firm* — Locke Lord LLP

(57) ABSTRACT

A power module substrate includes an insulating layer, a circuit layer that is formed on a first surface of the insulating layer, and a metal layer that is formed on a second surface of the insulating layer, in which a first base layer is laminated on a surface of the metal layer on the opposite side of the surface to which the insulating layer is provided, and the first base layer has: a first glass layer that is formed at the interface with the metal layer; and a first Ag layer that is laminated on the first glass layer.

14 Claims, 8 Drawing Sheets

(51) Int. Cl.

| | | |
|---|---|---|
| *H01L 23/373* | (2006.01) | |
| *C04B 37/02* | (2006.01) | |
| *H05K 1/03* | (2006.01) | |
| *H05K 1/09* | (2006.01) | |
| *H05K 3/46* | (2006.01) | |
| *H05K 7/14* | (2006.01) | |
| *H01L 23/42* | (2006.01) | |
| *H05K 3/00* | (2006.01) | |
| *H01L 23/473* | (2006.01) | |

(52) U.S. Cl.
CPC ......... *H05K 1/0203* (2013.01); *H05K 1/0298* (2013.01); *H05K 1/0306* (2013.01); *H05K 1/09* (2013.01); *H05K 3/465* (2013.01); *H05K 7/14* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/86* (2013.01); *H01L 23/42* (2013.01); *H01L 23/473* (2013.01); *H01L 2224/32225* (2013.01); *H05K 3/0061* (2013.01)

(56) References Cited

U.S. PATENT DOCUMENTS

2014/0080262 A1\* 3/2014 Nishimura .......... H01L 23/3735 438/122

FOREIGN PATENT DOCUMENTS

| | | | |
|---|---|---|---|
| JP | 2009-224571 | A | 10/2009 |
| JP | 2010-098057 | A | 4/2010 |
| JP | 2010-287554 | A | 12/2010 |
| JP | 2010-287869 | A | 12/2010 |
| JP | 2012-109315 | A | 6/2012 |
| JP | 2013-168240 | A | 8/2013 |
| WO | WO-2006/019099 | A1 | 2/2006 |
| WO | WO-2012/090740 | A1 | 7/2012 |

OTHER PUBLICATIONS

English translation Hitachi LTD JP2012-138541.\*
International Search Report mailed Mar. 4, 2014, issued for PCT/JP2013/084373 and English translation thereof.
Search Report dated Apr. 25, 2016, issued for the European patent application No. 13866760.5.

\* cited by examiner

US 9,693,449 B2

POWER MODULE SUBSTRATE, POWER MODULE SUBSTRATE WITH METAL PART, POWER MODULE WITH METAL PART, METHOD FOR PRODUCING POWER MODULE SUBSTRATE, AND METHOD FOR PRODUCING POWER MODULE SUBSTRATE WITH METAL PART

TECHNICAL FIELD

The present invention relates to a power module substrate including a circuit layer formed on one surface (first surface) of an insulating layer and a metal layer formed on the other surface (second surface) of the insulating layer, a power module substrate with a metal part including a metal part bonded to the metal layer side of the power module substrate, a power module with a metal part including a semiconductor element mounted on a circuit layer side of the power module substrate with a metal part, a method for producing a power module substrate with a metal part, and a method for producing a power module substrate with a metal part.

Priority is claimed on Japanese Patent Application No. 2012-284641, filed Dec. 27, 2012, the content of which is incorporated herein by reference.

BACKGROUND ART

Among various semiconductor elements, the amount of heat generated in a high power control power device used for controlling electric automobiles, electric vehicles and the like is large. Thus, for example, a power module substrate obtained by bonding a metal plate having excellent conductivity, as a circuit layer, to a ceramic substrate (insulating layer) composed of AlN (aluminum nitride) as a substrate on which the power device is mounted and bonding a metal plate having excellent thermal conductivity for radiating heat to the lower surface of the ceramic substrate as a circuit layer has been widely used in the related art.

In such a power module substrate, a semiconductor element is mounted on the circuit layer as a power device through a solder material.

In this kind of power module substrate, a metal part such as a radiator plate, a cooler, or a buffering plate is further bonded to the metal layer side in some cases.

For example, in PTL 1, a power module substrate is disclosed which has a circuit layer composed of Al formed on one surface (first surface) of an insulating layer and a metal layer composed of Al formed on the other surface (second surface) of the insulating layer. A power module substrate is also disclosed which has a heat sink (power module substrate with a metal part) obtained by bonding a heat sink (metal part) to the surface of the metal layer of the power module substrate by brazing.

In addition, in PLTs 2 and 3, a power module substrate is disclosed which has a buffering layer (power module substrate with a metal part) obtained by bonding a buffering layer (metal part) composed of aluminum to a surface of a metal layer of a power module substrate by brazing.

Further, in PTL 4, a power module substrate having a buffering layer (power module substrate with a metal part) obtained by bonding a buffering layer (metal part) composed of a metal matrix composite (aluminum matrix composite) to a surface of a metal layer of a power module substrate by brazing.

These power module substrates having a buffering layer are power module substrates with a heat sink obtained by further bonding a heat sink to the buffering layer.

CITATION LIST

Patent Literature

[PTL 1] Japanese Unexamined Patent Application, First Publication No. 2008-16813
[PTL 2] Japanese Unexamined Patent Application, First Publication No. 2009-135392
[PTL 3] Japanese Unexamined Patent Application, First Publication No. 2009-224571
[PTL 4] Japanese Unexamined Patent Application, First Publication No. 2010-098057

SUMMARY OF INVENTION

Technical Problem

However, in the power module substrates with a heat sink and the power module substrates having a buffering layer disclosed in PTLs 1 to 4, the metal layer of the power module substrate and the metal part are bonded by brazing. In the brazing, since the bonding temperature during brazing is high (for example, about 650° C.), the thermal load applied to the power module substrate is large and the power module substrate (particularly, the insulating layer) is deteriorated in some cases.

Further, since the bonding temperature is high in the brazing, thermal stress generated in the power module substrate and the metal part is increased and thus the power module substrate and the metal part is warped in a larger extent in some cases.

The present invention is made in consideration of the above-described circumstances and an object thereof is to provide a power module substrate capable of reducing a thermal load applied to the power module substrate and reducing warpage generated in the power module substrate and a metal part when the metal layer of the power module substrate and the metal part are bonded to each other, a power module substrate with a metal part, a power module with a metal part, a method for producing a power module substrate, and a method for producing a power module substrate with a metal part.

Solution to Problem (1) An aspect of the present invention provides a power module substrate including: an insulating layer; a circuit layer that is formed on a first surface of the insulating layer; and a metal layer that is formed on a second surface of the insulating layer, wherein a first base layer, to which a bonding layer composed of a sintered body of a bonding material including at least one of metal particles and metal oxide particles is bonded, is laminated on a surface of the metal layer on an opposite side of the surface, to which the insulating layer is provided, and the first base layer has: a first glass layer that is formed at the interface with the metal layer; and a first Ag layer that is laminated on the first glass layer.

According to the power module substrate of the present invention, since the first base layer has a first glass layer that is formed at the interface with the metal layer, an oxide film formed on the surface of the metal layer by the glass component can be removed and thus the bonding strength between the first base layer and the metal layer can be ensured.

In addition, since the first Ag layer is laminated on the first glass layer, a metal part is provided on the metal layer side of the power module substrate and the power module substrate and a heat sink can be bonded through a boding layer composed of a sintered metal material. Since the bonding layer composed of the sintered metal material can be formed at a temperature lower than a brazing temperature, the power module substrate and the metal part can be bonded at a relatively low temperature and the thermal load applied to the power module substrate is reduced. Thus, the deterioration of the power module substrate can be limited. Further, the warpage generated in the power module substrate and the metal part can be reduced.

(2) In the power module substrate according to (1), the first base layer may be composed of a sintered body of a glass-containing Ag paste containing a glass component.

In this case, by sintering the glass-containing Ag paste containing a glass component, the first base layer having the first glass layer that is formed at the interface of the metal layer and the first Ag layer that is formed on the first glass layer in a laminated manner can be simply and reliably formed.

(3) In the power module substrate according to (1) or (2), glass may be dispersed in the first Ag layer, and the area percentage of the glass exposed on the surface of the first base layer may be 55% or less.

In this case, since the area percentage of the glass exposed on the surface of the first base layer is 55% or less, in the case in which the bonding layer composed of a sintered metal material is formed on the first base layer in a laminated manner, the first Ag layer and the bonding layer of the first base layer can be strongly bonded without the inhibition of the glass.

(4) In the power module substrate according to any one of (1) to (3), a second base layer may be formed on the surface of the circuit layer on the opposite side of the surface, to which the insulating layer is provided, and the second base layer may have: a second glass layer that is formed at the interface with the circuit layer; and a second Ag layer that is laminated on the second glass layer.

In this case, since the second base layer is formed on the surface of the circuit layer on the opposite side of the surface, to which the insulating layer is provided, and the second base layer has the second glass layer that is formed at the interface with the circuit layer, an oxide film that is formed on the surface of the circuit layer by the glass component can be removed and the bonding strength between the circuit layer and the second base layer can be ensured.

In addition, since the second base layer is formed, a semiconductor element can be bonded to the circuit layer through the bonding layer that is composed of a sintered metal material.

(5) In the power module substrate according to any one of (1) to (4), the insulating layer may a ceramic substrate made of a composition selected from a group consisting of AlN, $Si_3N_4$, and $Al_2O_3$.

Since the ceramic substrate made of a composition selected from a group consisting of AlN, $Si_3N_4$, and $Al_2O_3$ has excellent insulation and strength, the reliability of the power module can be improved. In addition, the circuit layer and the metal layer can be easily formed by bonding metal plates to the first surface and the second surface of the ceramic substrate.

(6) Another aspect of the present invention provides a power module substrate with a metal part including: the power module substrate according to any one of (1) to (5); and a metal part that is bonded to a metal layer side of the power module substrate, wherein a bonding layer that is composed of a sintered metal material is formed between the first base layer and the metal part.

According to the power module substrate with a metal part having this configuration, since the bonding layer that is composed of a sintered metal material is formed between the first base layer and the metal part, the power module substrate (metal layer) and the metal part can be strongly bonded to each other. In addition, since the bonding layer that is composed of the sintered metal material can be formed at a temperature lower than a brazing temperature, the power module substrate and the metal part can be bonded at a relatively low temperature and the thermal load applied to the power module substrate is reduced. Further, the warpage generated in the power module substrate and the metal part can be reduced.

(7) In the power module substrate with a metal part according to (6), the bonding layer of the power module substrate with a metal part may be composed of a sintered body of a bonding material including at least one of metal Ag particles and Ag oxide particles.

In this case, since the same Ag components are bonded at the time of bonding the first Ag layer of the first base layer and the bonding layer, the first base layer and the bonding layer can be further strongly bonded.

(8) Still another aspect of the present invention provides a power module with a metal part including: the power module substrate with a metal part according to (6) or (7); and a semiconductor element that is mounted on the circuit layer side of the power module substrate with a metal part.

According to the power module with a metal part of the present invention, as described above, since the power module substrate with a metal part with reduced thermal deterioration of the power module substrate occurring at the time of bonding the power module substrate and the metal part and reduced warpage generated in the power module substrate and the metal part is provided, the reliability can be improved.

(9) Still another aspect of the present invention provides a method for producing a power module substrate including an insulating layer, a circuit layer that is formed on a first surface of the insulating layer, and a metal layer that is formed on a second surface of the insulating layer, the method including the step of: forming a first base layer, to which a bonding layer composed of a sintered body of a bonding material including at least one of metal particles and metal oxide particles is bonded, by: applying a glass-containing Ag paste containing a glass component onto a surface of the metal layer on the opposite side of the surface, to which the insulating layer is provided; and performing a heating treatment.

(10) Still another aspect of the present invention provides a method for producing a power module substrate with a metal part including a power module substrate having a circuit layer that is formed on a first surface of an insulating layer and a metal layer that is formed on a second surface of the insulating layer, and a metal part that is bonded to the metal layer side of the power module substrate, the method including the steps of: forming a first base layer, to which a bonding layer composed of a sintered body of a bonding material including at least one of metal particles and metal oxide particles is bonded, by: applying a glass-containing Ag paste containing a glass component onto a surface of the metal layer on the opposite side of the surface, to which the insulating layer is provided; and performing a heating treatment; applying a bonding material including one of the group consisting of metal Ag particles and Ag oxide particles onto the surface of the first base layer; laminating a metal part on the applied bonding material; and forming a bonding layer that bonds the first base layer and the metal part by heating the power module substrate and the metal part in a state in which the power module substrate and the metal part are laminated.

According to the method for producing a power module substrate having this configuration or the method for producing a power module substrate with a metal part with this configuration, since the step of forming a first base layer by; applying a glass-containing Ag paste containing a glass component onto a surface of the metal layer on the opposite side of the surface, to which the insulating layer is provided; and performing a heating treatment is provided, an oxide film formed on the surface of the metal layer can be removed and the metal layer and the first base layer can be reliably bonded.

Further, in the case in which the step of applying a bonding material including at least one of Ag particles and Ag oxide particles onto the first base layer; the step of laminating a metal part on the applied bonding material; and forming a bonding layer that bonds the first base layer and the metal part and the metal part by heating the power module substrate and the metal part in a state in which the power module substrate and the metal part are laminated are provided, the first base layer and the metal part can be strongly bonded during sintering of the bonding layer.

Since the above-described sintering temperature of the bonding material is lower than a brazing temperature, the thermal load applied to the power module substrate is reduced to limit deterioration of the power module substrate. Further, the warpage generated in the power module substrate and the metal part can be reduced.

(11) In the method for producing a power module substrate according to (9), a sintering temperature for the glass-containing Ag paste in the step of forming a first base layer may be 350° C. or higher and 645° C. or lower.

In this case, since the sintering temperature for the glass-containing Ag paste is 350° C. or higher, an organic component or the like in the glass-containing Ag paste can be removed and the first base layer can be reliably formed. In addition, since the sintering temperature for the glass-containing Ag paste is 645° C. or lower, the thermal deterioration of the power module substrate can be prevented and warpage can be reduced.

(12) In the method for producing a power module substrate with a metal part according to (10), a sintering temperature for the bonding material in the step of forming the bonding layer may be 150° C. or higher and 400° C. or lower.

In this case, since the sintering temperature for the bonding material is 150° C. or higher, a reducing agent or the like included in the bonding material can be removed and the thermal conductivity and strength of the bonding layer can be ensured. In addition, since the sintering temperature for the bonding material is 400° C. or lower, the temperature when the bonding material is sintered to bond the power module substrate and the metal part can be kept low, and thus, the thermal load applied to the power module substrate can be reduced and the warpage generated in the power module substrate and the metal part can be reduced.

Advantageous Effects of Invention

According to the present invention, it is possible to provide a power module substrate capable of reducing the thermal load applied to the power module substrate and reducing the warpage generated in the power module substrate and a metal part when the metal layer of the power module substrate and the metal part are bonded, a power module substrate with a metal part, a power module with a metal part, a method for producing a power module substrate, and a method for producing a power module substrate with a metal part.

DESCRIPTION OF EMBODIMENTS

Figure 1:
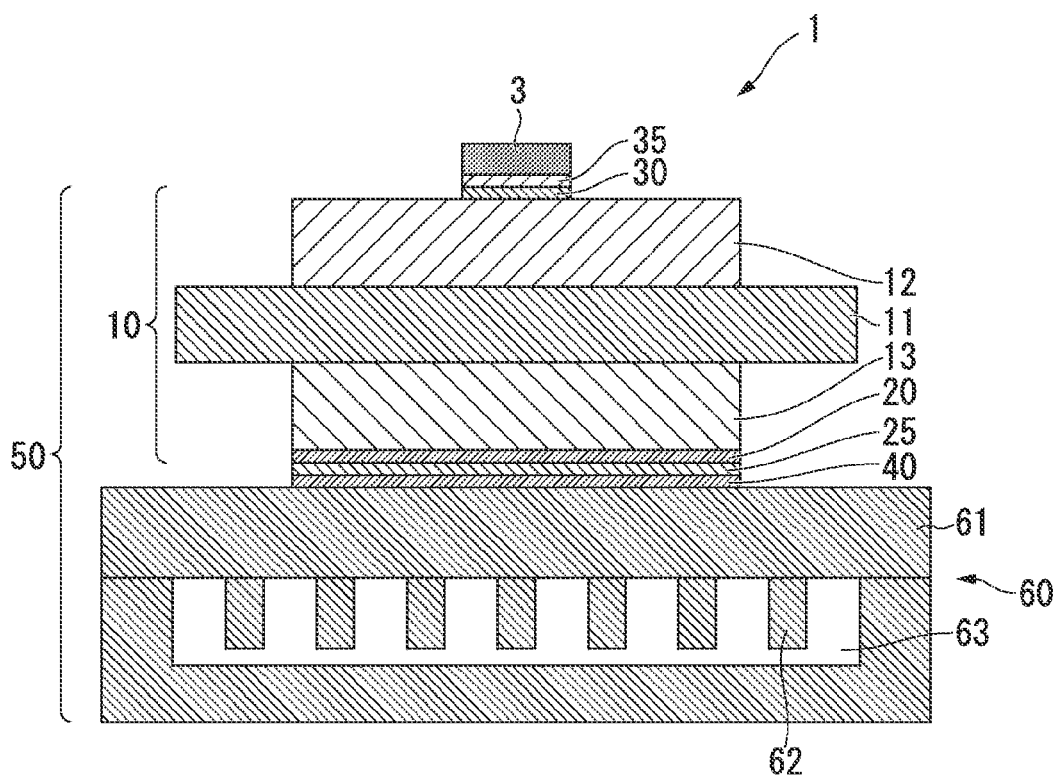
FIG. 1 is a schematic explanatory view of a power module with a heat sink according to an embodiment of the present invention.

Hereinafter, an embodiment of the present invention will be described with reference to the attached drawings. In FIG. 1, a power module 1 with a heat sink (power module with a metal part) according to an embodiment of the present invention is shown.

The power module 1 with a heat sink includes a power module substrate 10, a semiconductor element 3 that is bonded to one surface of the power module substrate 10 (the upper surface in FIG. 1), and a heat sink 60 (metal part) that is bonded to the other surface of the power module substrate (the lower surface in FIG. 1).

The power module substrate 10 includes a ceramic substrate 11 (insulating layer), a circuit layer 12 that is formed on one surface of the ceramic substrate 11 (which is the first surface and the upper surface in FIG. 1), and a metal layer 13 that is formed on the other surface of the ceramic substrate 11 (which is the second surface and the lower surface in FIG. 1).

The ceramic substrate 11 prevents electrical connection between the circuit layer 12 and the metal layer 13 and is composed of AlN (aluminum nitride) having a high degree of insulation. In addition, the thickness of the ceramic substrate 11 is set to be within a range of 0.2 mm to 1.5 mm and is set to 0.635 mm in the embodiment.

The metal layer 13 is formed by bonding a metal plate of aluminum, an aluminum alloy, copper, a copper alloy or the like to the second surface of the ceramic substrate 11. In the embodiment, the metal layer 13 is formed by bonding an aluminum plate composed of a rolled plate of aluminum (so-called 4N aluminum) having a purity of 99.99% by mass or more to the ceramic substrate 11.

A first base layer 20 composed of a sintered body of a glass-containing Ag paste, which will be described later, is formed on the surface of the metal layer 13 on the opposite side of the surface on which the ceramic substrate 11 is provided (the lower surface in FIG. 1) in a laminated manner.

Figure 2:
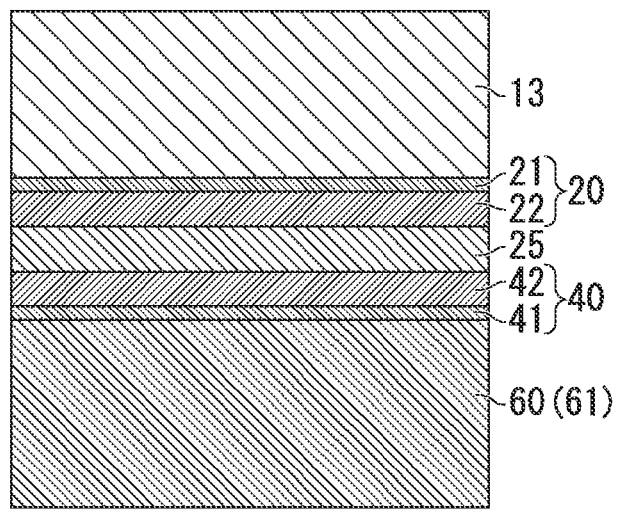
FIG. 2 is an enlarged explanatory view of the bonding interface between a metal layer in the power module with a heat sink and a heat sink shown in FIG. 1.
Figure 3:
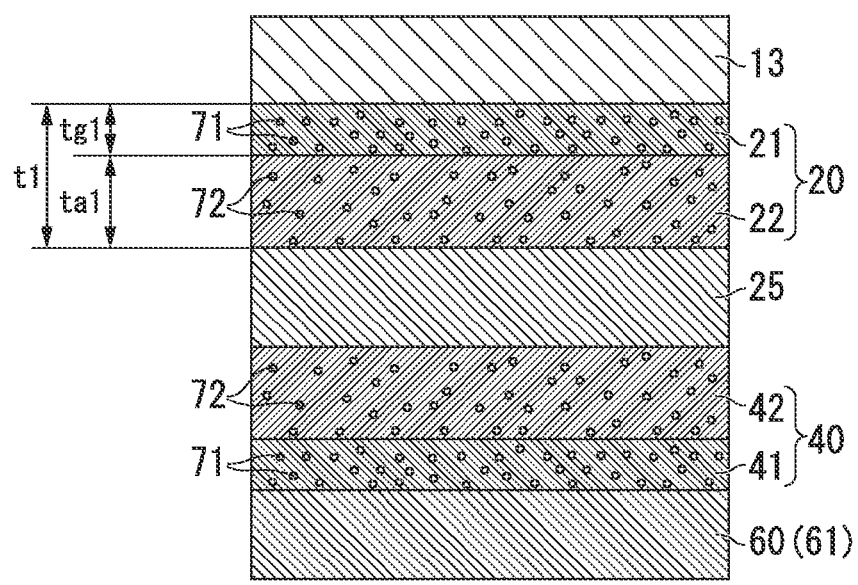
FIG. 3 is a further enlarged explanatory view of the bonding interface between the metal layer and the heat sink in FIG. 2.

As shown in FIGS. 2 and 3, the first base layer 20 includes a first glass layer 21 that is formed at the interface with the metal layer 13 and a first Ag layer 22 that is formed on the first glass layer 21.

Fine metal particles 71 having a particle size of about several nanometers are dispersed in the first glass layer 21. The metal particles 71 are crystalline particles containing at least one of Ag and Al. The metal particles 71 in the first glass layer 21 are observed by using, for example, a transmission electron microscopy (TEM).

In addition, fine glass 72 having a particle size of about several micronanometers is dispersed in the first Ag layer 22.

Here, in the embodiment, the power module substrate 10 is characterized in dispersion of the glass 72 in the first Ag layer 22. A large amount of glass 72 is present on the side closer to the first glass layer 21 formed at the interface with the metal layer 13 in the first Ag layer 22 and the glass is dispersed such that the number of the glass particles decreases as the glass separates from the first glass layer 21 in the thickness direction.

In the power module substrate 10 which is the embodiment, since the glass 72 is dispersed as described above, the area percentage of the glass 72 exposed on the surface of the first Ag layer 22 (first base layer 20) (the lower surface in FIG. 2) is 55% or less.

The area percentage of the glass 72 exposed on the surface of the first Ag layer 22 (first base layer 20) can be calculated from a reflection electron image obtained by an electron microscope.

In addition, in the embodiment, since the metal layer 13 is composed of aluminum having a purity of 99.99%, an aluminum oxide film that is naturally formed in the atmosphere is formed on the surface of the metal layer 13. Here, in the portion in which the above-described first base layer 20 is formed, the aluminum oxide film is removed and the first base layer 20 is directly laminated on the metal layer 13. That is, the aluminum constituting the metal layer 13 and the first glass layer 21 are directly bonded.

In the embodiment, the thickness tg1 of the first glass layer 21 is 0.01 μm≤tg1≤5 μm, the thickness ta1 of the first Ag layer is 1 μm≤ta1≤100 μm, and the total thickness t1 of the first base layer 20 is 1.01 μm≤t1≤105 μm.

The circuit layer 12 is formed by bonding a conductive metal plate of aluminum, an aluminum alloy, copper, a copper alloy, or the like to the first surface of the ceramic substrate 11 (the upper surface in FIG. 1). In the embodiment, the circuit layer 12 is formed by bonding an aluminum plate composed of a rolled plate of aluminum (so-called 4N aluminum) having a purity of 99.99% or more to the ceramic substrate 11 similar to the metal layer 13. In addition, a circuit pattern is formed on the circuit layer 12 and one surface of the circuit layer (the upper surface in FIG. 1) is a surface on which the semiconductor element 3 is mounted.

A second base layer 30 composed of a sintered body of a glass-containing Ag paste, which will be described later, is formed on the surface of the circuit layer 12 on the opposite side of the surface on which the ceramic substrate 11 is provided (the upper surface in FIG. 1). As shown in FIG. 1, the second base layer 30 is not formed over the entire surface of the circuit layer 12 but formed selectively only in the portion in which the semiconductor element 3 is provided.

Figure 4:
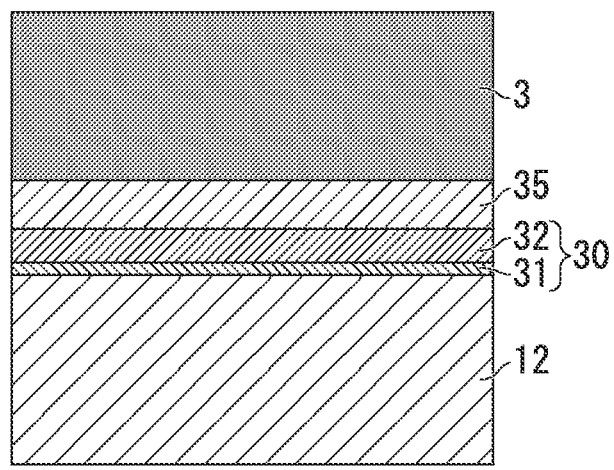
FIG. 4 is an enlarged explanatory view of the bonding interface between a circuit layer and a semiconductor element in the power module shown in FIG. 1.
Figure 5:
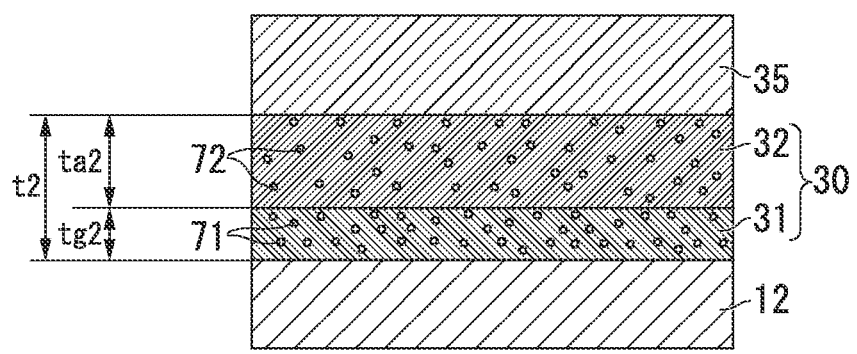
FIG. 5 is an enlarged explanatory view of the bonding interface between the circuit layer and the bonding layer in FIG. 4.

As shown in FIGS. 4 and 5, the second base layer 30 includes a second glass layer 31 that is formed at the interface with the circuit layer 12 and a second Ag layer 32 that is formed on the second glass layer 31.

The fine metal particles 71 having a particle size of about several nanometers are dispersed in the second glass layer 31, similar to the first glass layer 21. In addition, the fine glass 72 having a particle size of about several micronanometers is dispersed in the second Ag layer 32, similar to the first Ag layer 22. Further, the area percentage of the glass 72 exposed on the surface of the second Ag layer 32 (second base layer 30) (the upper surface in FIG. 4) is 55% or less, similar to the first Ag layer 22.

In the embodiment, an aluminum oxide film that is naturally formed in the atmosphere is formed on the surface of the circuit layer 12. However, in the portion in which the above-described second base layer 30 is formed, the aluminum oxide film is removed and the second base layer 30 is directly formed on the circuit layer 12 in a laminated manner.

In addition, in the embodiment, the thickness tg2 of the second glass layer 31 is 0.01 μm≤tg2≤5 μm, the thickness ta2 of the second Ag layer 32 is 1 μm≤ta2≤100 μm, and the total thickness t2 of the second base layer 30 is 1.01 μm≤t2≤105 μm.

An electrical resistance P of the second base layer 30 in the thickness direction is 0.5Ω or less. Here, in the embodiment, the electrical resistance P of the second base layer 30 in the thickness direction is set to an electrical resistance between the upper surface of the second base layer 30 and the upper surface of the circuit layer 12. This is because the electrical resistance of 4N aluminum constituting the circuit layer 12 is much lower than the electrical resistance of the second base layer 30 in the thickness direction. When the electrical resistance is measured, the electrical resistance between the center point of the upper surface of the second base layer 30 and the point on the circuit layer 12 which is distant from the end portion of the second base layer 30 by the same distance as the distance from the center point of the upper surface of the second base layer 30 to the end portion of the second base layer 30 is measured.

The heat sink 60 (metal part) cools the above-described power module substrate 10 and includes a top plate portion 61 to be bonded to the power module substrate 10, a heat radiating fan 62 that is suspended downward from the top plate portion 61, and a flow passage 63 in which a cooling medium (for example, cooling water) flows. The heat sink 60 (top plate portion 61) is desirably composed of a material having good thermal conductivity and is composed of aluminum material of A6063 (aluminum alloy) in the embodiment.

A third base layer 40 composed of a sintered body of a glass-containing Ag paste, which will be described later, is formed on the surface of the top plate portion 61 in the heat sink 60.

As shown in FIGS. 2 and 3, the third base layer 40 includes a third glass layer 41 that is formed at the interface with the heat sink 60 and a third Ag layer 42 that is formed on the third glass layer 41.

The fine metal particles 71 having a particle size of about several nanometers are dispersed in the third glass layer 41, similar to the first glass layer 21. In addition, the fine glass 72 having a particle size of about several micronanometers is dispersed in the third Ag layer 42, similar to the first Ag layer 22. Further, the area percentage of the glass 72 exposed on the surface of the third Ag layer 42 (third base layer 40) (the upper surface in FIG. 2) is 55% or less.

In addition, since the heat sink 60 is composed of A6063 in the embodiment, an aluminum oxide film that is naturally formed in the atmosphere is formed on the surface of the metal layer 13. Here, in the portion in which the above-described third base layer 40 is formed, the aluminum oxide film is removed and the third base layer 40 is directly formed on the heat sink 60 in a laminated manner.

This thickness of the third glass layer 41, the thickness of the third Ag layer 42, and the thickness of the third base layer 40 are the same as the thickness of the first glass layer 21, the thickness of the first Ag layer 22, and the thickness of the first base layer 20, respectively.

A power module substrate 50 with a heat sink (power module substrate with a metal part) according to this embodiment includes the power module substrate 10 on which the circuit layer 12 and the metal layer 13 are formed and the heat sink 60 (metal part) that is bonded to the metal layer 13 of the power module substrate 10.

The metal layer 13 and the heat sink 60 are bonded through a bonding layer 25.

The bonding layer 25 is formed of a sintered body of a bonding material including at least one of metal Ag particles (metal particles) and Ag oxide particles (metal oxide particles) and is formed of a sintered body of a silver oxide paste (bonding material) including silver oxide and a reducing agent as described later in the embodiment. Here, the reduced Ag particles formed by reduction of silver oxide have a particle size of, for example, 10 nm to 1 μm, which is very fine. Thus, a sintered layer of dense Ag is formed. In the bonding layer 25, the glass 72 observed in the first Ag layer 22 and the third Ag layer 42 is not present or a very small amount of glass is present. Further, the sizes of Ag particles are different and thus even after the first base layer 20 and the third base layer 40 are bonded, the first base layer 20, the bonding layer 25, and the third base layer 40 can be distinguished.

In the embodiment, the thickness of the bonding layer 25 is set to be within a range of 5 μm or more and 50 μm or less.

The power module 1 with a heat sink includes the above-described power module substrate 50 with a heat sink and the semiconductor element 3 bonded to the circuit layer 12 of the above-described power module substrate 50 with a heat sink.

The semiconductor element 3 and the circuit layer 12 are bonded through a bonding layer 35 composed of a sintered body of a bonding material including at least one of metal Ag particles and Ag oxide particles. The bonding layer 35 is composed of a sintered body of a silver oxide paste (bonding material) including silver oxide and a reducing agent, similar to the above-described bonding layer 25.

Next, the glass-containing Ag paste constituting the first base layer 20, the second base layer 30, and the third base layer 40 will be described.

The glass-containing Ag paste contains a Ag powder, a glass powder containing ZnO, a resin, a solvent, and a dispersant. The amount of the powder component composed of the Ag powder and the glass powder is 60% by mass or more and 90% by mass or less with respect to the total amount of the glass-containing Ag paste, and the balance includes a resin, a solvent, and a dispersant. In the embodiment, the amount of the powder component composed of the Ag powder and the glass powder is 85% by mass with respect to the total amount of the glass-containing Ag paste.

In addition, the viscosity of the glass-containing Ag paste is adjusted to 10 Pa·s or more and 500 Pa·s or less and more preferably 50 Pa·s or more and 300 Pa·s or less.

The particle size of the Ag powder is 0.05 μm or more and 1.0 μm or less and the average particle size thereof is 0.8 μm in the embodiment.

The glass powder includes $Bi_2O_3$, ZnO, and $B_2O_3$ as main components. The glass transition temperature of the glass powder is 300° C. or higher and 450° C. or less, the softening temperature is 600° C. or lower, and the crystallization temperature is 450° C. or higher.

Further, the weight ratio A/G between the weight A of the Ag powder and the weight G of the glass powder is adjusted to be within a range of 80/20 to 99/1 and is A/G=80/5 in the embodiment.

A solvent having a boiling point of 200° C. or higher is suitable and diethylene glycol dibutyl ether is used in the embodiment.

The resin is used to adjust the viscosity of the glass-containing Ag paste, and a resin which is decomposed at 500° C. or higher is suitable. In the embodiment, ethyl cellulose is used.

Moreover, in the embodiment, a dicarboxylic acid-based dispersant is added. The glass-containing Ag paste may also be configured without adding a dispersant.

Here, the glass powder used in the embodiment will be described in detail. The glass composition of the glass powder in the embodiment is as follows:

$Bi_2O_3$: 68% by mass or more and 93% by mass or less;
ZnO: 1% by mass or more and 20% by mass or less;
$B_2O_3$: 1% by mass or more and 11% by mass or less;
$SiO_2$: 5% by mass or less;
$Al_2O_3$: 5% by mass or less; and
an alkaline earth metal oxide: 5% by mass or less.

That is, the glass powder includes $Bi_2O_3$, ZnO, and $B_2O_3$ as essential components and additionally, $SiO_2$, $Al_2O_3$, and the alkaline earth metal oxide (MgO, CaO, BaO, SrO or the like) are appropriately added as required.

Such a glass powder is manufactured in the following manner. The above-described various oxides, and carbonates or ammonium salts are used as the raw materials. The raw materials are put into a platinum crucible, an alumina crucible, a quartz crucible, or the like and melted in a melting furnace. The melting condition is not particularly limited and the temperature is preferably set to be within a range of 900° C. or higher and 1300° C. or lower for 30 minutes or more and 120 minutes or less such that all the raw materials are uniformly mixed in a liquid phase.

The obtained molten material is dropped to carbon, steel, a copper plate, twin rolls, water, and the like and rapidly cooled. Thus, a uniform glass gob is extruded.

The glass gob is pulverized by a ball mill, a jet mill, and the like and coarse particles are classified to obtain a glass powder. Here, in the embodiment, the center particle size D50 of the glass powder is within a range of 0.1 μm or more and 5.0 μm or less.

Figure 6:
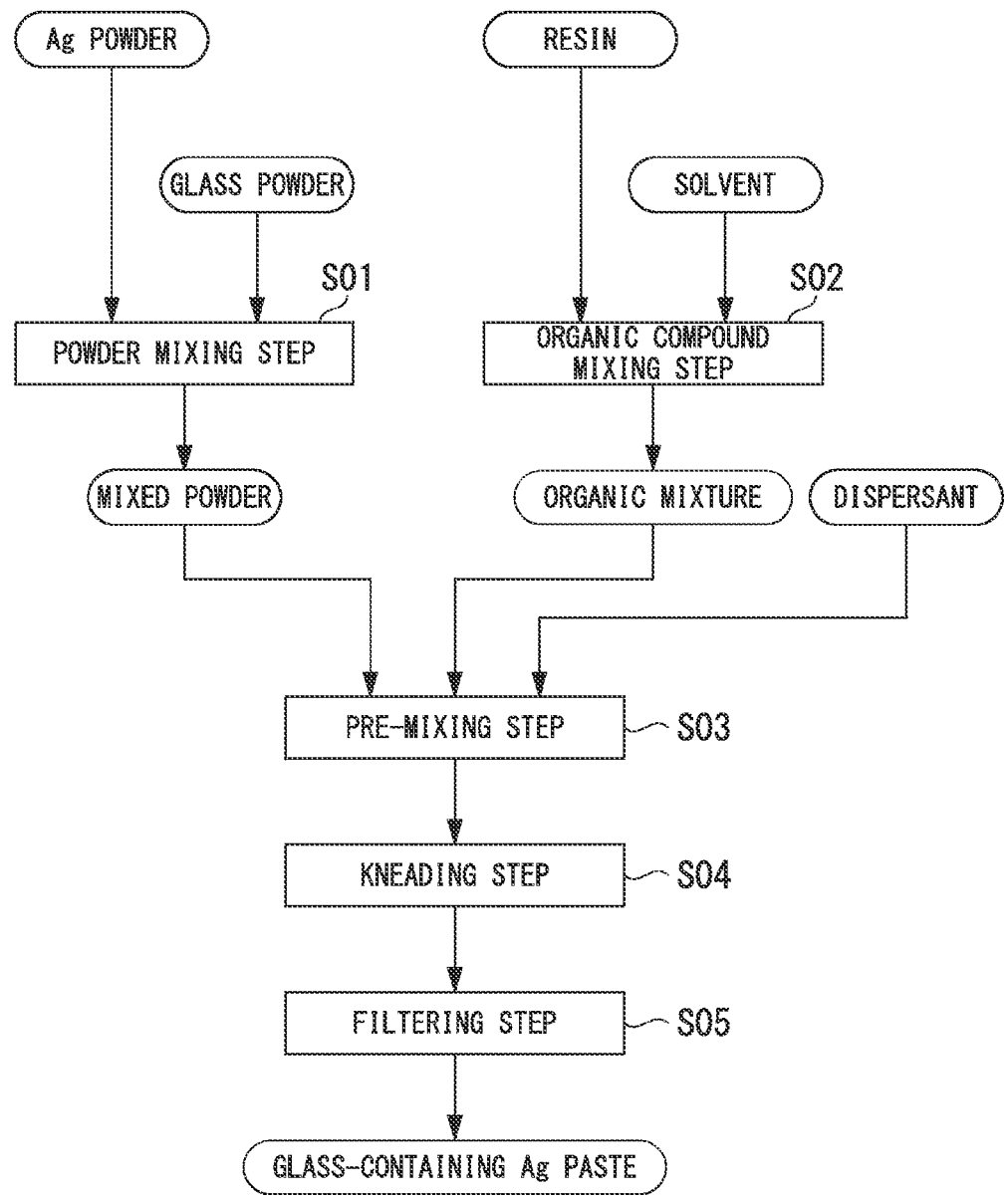
FIG. 6 is a flow diagram showing a method for producing a glass-containing Ag paste.

Next, a method for producing the glass-containing Ag paste will be described with reference to the flow diagram shown in FIG. 6.

First, a power mixture is produced by mixing the above-described Ag powder and the glass powder (power mixing step S01). In addition, an organic mixture is produced by mixing a solvent and a resin (organic compound mixing step S02).

Then, the power mixture, the organic mixture, and a dispersant are premixed by a mixer (pre-mixing step S03).

Next, the premixture is mixed while being kneaded by using a roll mill (kneading step S04).

The obtained kneading is filtered by using a paste filter (filtering step S05).

In this manner, the above-described glass-containing Ag paste is produced.

Next, the silver oxide paste (bonding material) constituting the bonding layers 25 and 35 will be described.

The silver oxide paste contains a silver oxide powder, a reducing agent, a resin and a solvent and contains an organic metal compound powder in the embodiment in addition to these components.

The amount of the silver oxide powder is 60% by mass or more and 80% by mass or less with respect to the total amount of the silver oxide paste, the amount of the reducing agent is 5% by mass or more and 15% by mass or less with respect to the total amount of the silver oxide paste, the amount of the organic metal compound powder is 0% by mass or more and 10% by mass or less with respect to the total amount of the silver oxide paste, and the balance includes a solvent. Here, the dispersant and the resin are not added to the silver oxide paste in order to prevent unreacted organic substances from remaining in the bonding layers 25 and 35 obtained by sintering.

The viscosity of the silver oxide paste is adjusted to 10 Pa·s or more and 100 Pa·s or less and more preferably 30 Pa·s or more and 80 Pa·s or less.

A silver oxide powder having a particle size of 0.1 μm or more and 40 μm or less is used.

The reducing agent is composed of an organic substance having reducibility and for example, alcohols and organic acids can be used.

When the reducing agent is an alcohol, for example, primary alcohols such as methanol, ethanol, propanol, butyl alcohol, pentyl alcohol, hexyl alcohol, octyl alcohol, nonyl alcohol, decyl alcohol, undecyl alcohol, dodecyl alcohol, lauryl alcohol, myristyl alcohol, cetyl alcohol, and stearyl alcohol can be used. In addition to the alcohols, compounds having multiple alcohol groups may be used.

When the reducing agent is an organic acid, for example, saturated fatty acids such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, and nonadecanoic acid can be used. In addition to the saturated fatty acids, unsaturated fatty acids may be used.

When the reducing agent is a reducing agent whose reduction reaction does not easily proceed after being mixed with the silver oxide powder, the storage stability of the silver oxide powder is improved. As the reducing agent, a reducing agent having a boiling point of room temperature or higher is preferable and specifically, myristyl alcohol, 1-dodecanol, 2,5-dimethyl-2,5-hexanediol, 2,2-dimethyl-1,3-propanediol, 1,6-hexanediol, 1,2,6-hexanetriol, 1,10-decanediol, myristic acid, decanoic acid, and the like are preferably used.

The organic metal compound has an action of promoting the reduction reaction of the silver oxide by an organic acid produced by thermal decomposition. Examples of the organic metal compound having such an action include carboxylic acid-based metal salts such as Ag formate, Ag acetate, Ag propionate, Ag benzoate, Ag oxalate, and the like.

From the viewpoint of ensuring the storage stability of the silver oxide paste and printability, a solvent having a high boiling point (150° C. to 300° C.) is preferably used.

Specifically, α-terpineol, 2-ethylhexyl acetate, 3-methylbuthyl acetate, and the like can be used.

Figure 7:
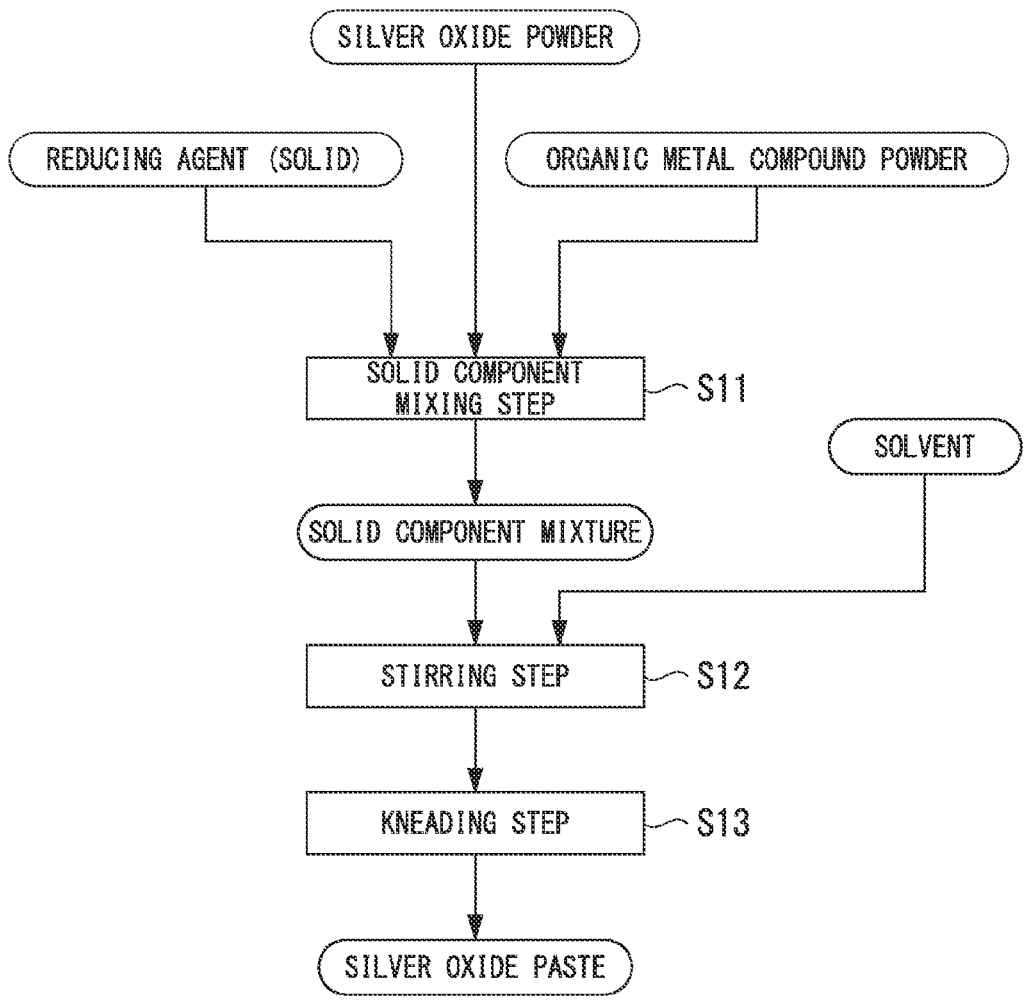
FIG. 7 is a flow diagram showing a method for producing a silver oxide paste.

Next, the method for producing the above-described silver oxide paste will be described with reference to the flow diagram shown in FIG. 7.

First, a solid component mixture is produced by mixing the above-described silver oxide powder, a reducing agent (solid), and an organic metal compound powder (solid component mixing step S11).

Next, a solvent is added to the solid component mixture and the mixture is stirred (stirring step S12).

Then, the stirred substance is mixed while being kneaded by using a roll mill (for example, 3 roll mills) (kneading step S13).

In this manner, the above-described silver oxide paste is produced. The obtained silver oxide paste is preferably stored at a low temperature (for example, 5° C. to 15° C.) using a refrigerator or the like.

Figure 8:
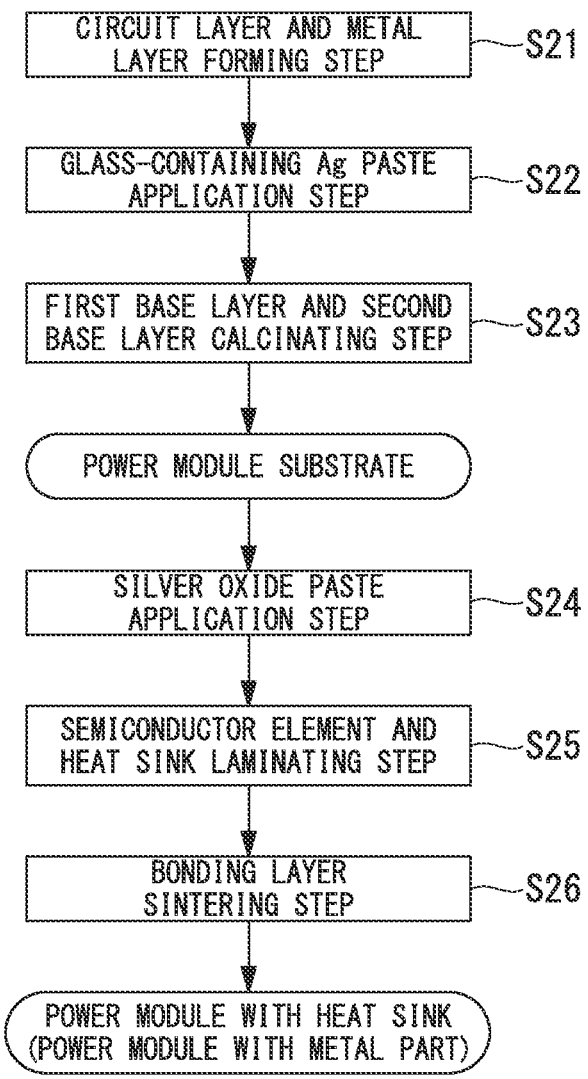
FIG. 8 is a flow diagram showing a method for producing the power module with a heat sink in FIG. 1.

Next, a method for producing the power module with a heat sink, which is the embodiment, will be described with reference to the flow diagram shown in FIG. 8.

First, an aluminum plate serving as the circuit layer 12 and an aluminum plate serving as the metal layer 13 are prepared and these aluminum plates are respectively laminated on the first surface and the second surface of the ceramic substrate 11 through a brazing material and cooled after being pressed and heated. Thus, the aluminum plates and the ceramic substrate 11 are bonded (circuit layer and metal layer forming step S21). The brazing temperature is set to 640° C. to 650° C.

Next, the glass-containing Ag paste is applied to the surfaces of the circuit layer 12 and the metal layer 13 (glass-containing Ag paste application step S22).

When the glass-containing Ag paste is applied, various methods such as a screen printing method, an offset printing method, and a photosensitive process can be adopted. In the embodiment, the glass-containing Ag paste is applied to the portion in which the semiconductor element 3 of the circuit layer 12 is mounted by a screen printing method and the portion in which the metal layer 13 and the heat sink 60 are bonded.

Next, the glass-containing Ag paste is dried in a state in which the glass-containing Ag paste is applied to the surfaces of the circuit layer 12 and the metal layer 13 and then put into a heating furnace to sinter the glass-containing Ag paste (first base layer and second base layer sintering step S23). At this time, the sintering temperature is set to 350° C. or higher and 645° C. or lower.

Figure 9A:
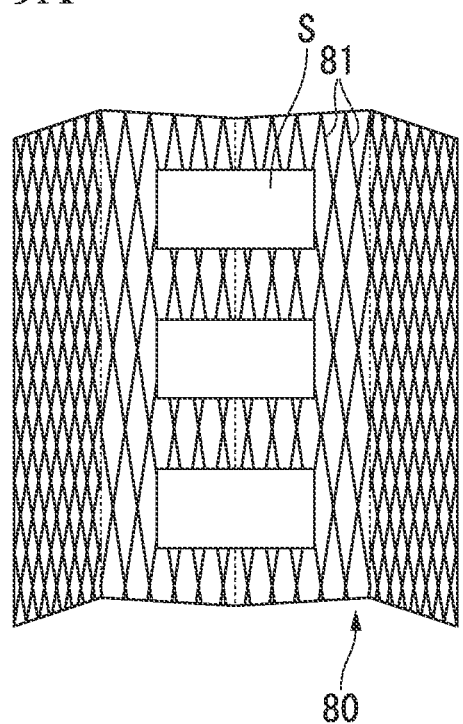
FIG. 9A is a plan view of a double side sintering tool.

In the first base layer and second base layer sintering step S23, as described above, the surfaces of the circuit layer 12 and the metal layer 13 are sintered at the same time in a state in which the glass-containing Ag paste is applied to the surfaces. As described above, in order to sinter both of the surfaces of the power module substrate 10, for example, a double side sintering tool 80 shown in FIGS. 9A and 9B may be used. FIG. 9A is a plan view of the double side sintering tool 80 and FIG. 9B is a side view of the double side sintering tool 80.

Figure 9B:
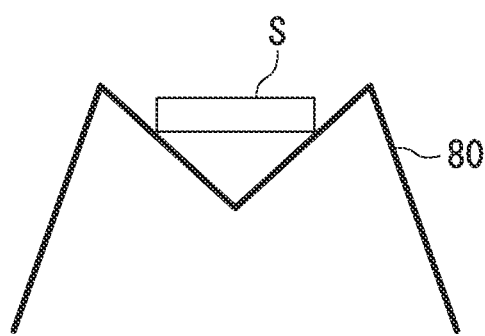
FIG. 9B is a side view of the double side sintering tool.

As shown in FIGS. 9A and 9B, the double side sintering tool 80 has a metal wire 81 arranged in a net-like shape and has an M shape as seen from the side. As shown in FIG. 9B, a sample S (power module substrate 10) is arranged such that the end portion of the sample S is brought into contact with a V-shaped portion of the double side sintering tool 80. In a state in which the sample S is arranged as described above, both of the surfaces of the sample S can be sintered by putting the double side sintering tool 80 into a heating furnace.

In addition, in the first base layer and second base layer sintering step S23, the resin contained in the dried glass-containing Ag paste is decomposed by heating and the glass 72 contained in the glass-containing Ag paste flows to the metal layer 13 in the first base layer 20 and to the circuit layer 12 in the second base layer 30. The first base layer 20 including the first glass layer 21 and the first Ag layer 22 is formed on the surface of the metal layer 13 and the second base layer 30 including the second glass layer 31 and the second Ag layer 32 is formed on the surface of the circuit layer 12.

At this time, by the first glass layer 21 and the second glass layer 31, an aluminum oxide film that is naturally formed on the surfaces of the metal layer 13 and the circuit layer 12 is melted and removed. Thus, the first glass layer 21 and the second glass layer 31 are directly formed on the metal layer 13 and the circuit layer 12.

Further, the fine metal particles 71 having a particle size of about several nanometers are dispersed in the first glass layer 21 and the second glass layer 31. It is assumed that the metal particles 71 are crystalline particles containing at least one of Ag and Al and are precipitated in the first glass layer 21 and the second glass layer 31 during sintering.

Further, the fine glass 72 having a particle size of about several micronanometers is dispersed in the first Ag layer 22 and the second Ag layer 32. It is assumed that the glass 72 is formed by aggregation of the glass component remaining during the step of sintering of Ag particles.

Here, the third base layer 40 is also formed on the surface of the top plate portion 61 of the heat sink 60 in the same method as the method for forming the above-described first base layer 20 and the second base layer 30.

Next, a silver oxide paste is applied onto the surfaces of the first base layer 20 and the second base layer 30 (silver oxide paste application step S24).

When the silver oxide paste is applied, various methods such as a screen printing method, an offset printing method, and a photosensitive process can be adopted. In the embodiment, the silver oxide paste is applied by a screen printing method.

Next, after the silver oxide paste is dried in a state in which the silver oxide paste is applied (for example, stored at room temperature in the atmosphere for 24 hours), the semiconductor element 3 is laminated on the second base layer 30, to which the silver oxide paste is applied, and the heat sink 60 is laminated on the first base layer 20, to which the silver oxide paste is applied (semiconductor element and heat sink laminating step S25).

Then, the semiconductor element 3, the power module substrate 10, and the heat sink 60 are put into a heating furnace in a state in which the semiconductor element, the power module substrate, and the heat sink are laminated and the silver oxide paste is sintered (bonding layer sintering step S26). At this time, the load is 0 MPa to 10 MPa and the sintering temperature is 150° C. or higher and 400° C. or lower.

In addition, desirably, the semiconductor element 3, the power module substrate 10, and the heat sink 60 are heated in a state in which the semiconductor element, the power module substrate, and the heat sink are compressed in a lamination direction. Thus, more reliable bonding can be achieved. In this case, the applied pressure is preferably 0.1 MPa to 10 MPa.

As described above, the power module substrate 10 having the bonding layer 25 formed between the first base layer 20 and the third base layer 40 and the heat sink 60 are bonded and the power module substrate 10 having the bonding layer 35 formed between the second base layer 30 and the semiconductor element 3 and the semiconductor element 3 are bonded.

In this manner, the power module 1 with a heat sink according to the embodiment is produced.

In the power module substrate 10 and the power module substrate 50 with a heat sink having the above-described configuration according to the embodiment, since the first base layer 20 includes the first glass layer 21 that is formed at the interface with the metal layer 13, the oxide film formed on the surface of the metal layer 13 by the glass component can be removed and the bonding strength between the first base layer 20 and the metal layer 13 can be ensured.

In addition, since the third base layer 40 that is formed on the heat sink 60 includes the third glass layer 41, the oxide film formed on the surface of the heat sink 60 by the glass component can be removed and the bonding strength between the third base layer 40 and the heat sink 60 can be ensured.

Further, since the first Ag layer 22 and the third Ag layer 42 are laminated on the first glass layer 21 and the third glass layer 41, the heat sink 60 is provided on the metal layer 13 of the power module substrate 10 and the power module substrate 10 and the heat sink 60 can be bonded through the bonding layer 25 composed of a sintered metal material.

Since the bonding layer 25 composed of a sintered metal material can be formed at a temperature lower than the brazing temperature, the power module substrate 10 and the heat sink 60 can be bonded at a relatively low temperature. Thus, the thermal load applied to the power module substrate 10 is reduced and thus the deterioration of the power module substrate 10 can be limited. Further, the warpage generated in the power module substrate 10 and the heat sink 60 also can be reduced.

In addition, since the first base layer 20 is composed of a sintered body of the glass-containing Ag paste containing a glass component, the first base layer 20 including the first glass layer 21 that is formed at the interface with the metal layer 13 and the first Ag layer 22 that is formed on the first glass layer 21 in a laminated manner can be simply and reliably formed.

Here, since the glass 72 is dispersed in the first Ag layer 22 and the area percentage of the glass 72 exposed on the surface of the first base layer 20 is 55% or less, in the case in which the bonding layer 25 composed of a sintered metal material is formed on the first base layer 20 in a laminated manner, the first Ag layer 22 of the first base layer 20 and the bonding layer 25 can be strongly bonded without the inhibition of the glass 72. In addition, since the area percentage of the glass 72 exposed on the surface of the third base layer 40 is also 55% or less in the third Ag layer 42 similar to the first base layer 20, the third Ag layer 42 of the third base layer 40 and the bonding layer 25 can be strongly bonded.

Further, since the metal particles 71 are dispersed in the first glass layer 21, the thermal conductivity of the first glass layer 21 of the first base layer 20 laminated on the metal layer 13 is ensured and thus the heat from the circuit layer 12 can be effectively radiated to the metal layer 13. In addition, since the metal particles 71 are also dispersed in the third glass layer 41, the thermal conductivity of the third glass layer 41 is ensured and the heat from the power module substrate 10 can be effectively radiated to the heat sink 60.

Since the second base layer 30 is formed on the surface of the circuit layer 12 on the opposite side of the surface on which the ceramic substrate 11 is provided and the second base layer 30 has the second glass layer 31 that is formed at the interface with the circuit layer 12 and the second Ag layer 32 that is laminated on the second glass layer 31, the oxide film formed on the surface of the circuit layer 12 by the glass component can be removed and thus the bonding strength between the circuit layer 12 and the second base layer 30 can be ensured.

Further, since the second base layer 30 is formed on the circuit layer 12, the semiconductor element 3 can be bonded to the circuit layer through the bonding layer 35 composed of a sintered metal material. In the embodiment, since the glass 72 is dispersed in the second Ag layer 32 and the area percentage of the glass 72 exposed on the surface of the second base layer 30 is 55% or less, in the case in which the bonding layer 35 composed of a sintered metal material is formed on the second base layer 30 in a laminated manner, the second Ag layer 32 of the second base layer 30 and the bonding layer 35 can be more strongly bonded without inhibition of the glass 72.

In addition, in this case, since the bonding layer 35 is laminated on the second base layer 30, a sufficient thickness of a layer to be interposed between the circuit layer 12 and the semiconductor element 3 can be ensured. Thus, in the power module 1 with a heat sink, stress can be prevented from being applied to the semiconductor element 3 during loading of a thermal cycle and damage to the semiconductor element 3 itself can be prevented.

Further, since the ceramic substrate 11 (insulating layer) is composed of AlN, the reliability of the power module 1 with a heat sink having excellent insulation and strength can be improved.

Moreover, the circuit layer 12 and the metal layer 13 can be easily formed by bonding metal plates to the first surface and the second surface of the ceramic substrate 11.

Since the bonding layer 25 is composed of a sintered body of a silver oxide paste in the power module substrate 50 with a heat sink, the same Ag components are bonded at the time of bonding the first Ag layer 22 of the first base layer 20 and the bonding layer 25, and thus, the first base layer 20 and the bonding layer 25 can be more strongly bonded.

In the power module 1 with a heat sink according to the embodiment, as described above, since the power module substrate 50 with a heat sink with reduced deterioration of the power module substrate 10 occurring when the power module substrate 10 and the heat sink 60 are bonded to each other and reduced warpage generated in the power module substrate 50 with a heat sink are reduced is provided, the reliability can be improved.

In the method for producing a power module substrate and the method for producing a power module substrate with a heat sink according to the embodiment, since the step of forming the first base layer 20 by: applying a glass-containing Ag paste containing a glass component to the surface of the metal layer 13 (the surface on the opposite side of the surface on which the ceramic substrate 11 is provided); and performing a heat treatment is provided, an oxide film formed on the surface of the metal layer 13 can be removed and the metal layer 13 and the first base layer 20 can be reliably bonded.

When the step of applying a silver oxide paste to the first base layer 20; the step of laminating a heat sink 60 on the applied silver oxide paste; and the step of forming a bonding layer 25 bonding the power module substrate 10 and the heat sink 60 by heating them in the state where they are laminated are provided, the first base layer 20 and the heat sink 60 can be strongly bonded during sitering of the bonding layer 25.

Further, since the sintering temperature for the glass-containing Ag paste is 350° C. or higher and 645° C. or lower in the step of forming the first base layer 20, an organic component and the like can be removed in the glass-containing Ag paste and the first base layer 20 can be reliably formed. In addition, since the sintering temperature for the glass-containing Ag paste is 645° C. or lower, the thermal deterioration of the power module substrate 10 can be prevented and the warpage can be reduced.

Since the sintering temperature for the silver oxide paste in the step of forming the bonding layer 25 is 400° C. or lower, the temperature when the power module substrate 10 and the heat sink 60 are bonded by sintering the silver oxide paste can be kept low. Thus, the thermal load on the power module substrate 10 can be reduced and the warpage generated in the power module substrate 10 and the heat sink 60 can be reduced. In addition, since the sintering temperature for the silver oxide paste is 150° C. or higher, a reducing agent or the like included in the silver oxide paste can be removed and the thermal conductivity and the strength of the bonding layer 25 can be ensured.

In the embodiment, since an organic metal compound is added into the silver oxide paste, the organic metal compound is thermally decomposed to produce an organic acid and a reduction reaction of silver oxide proceeds.

In addition, since a reducing agent to be mixed with the silver oxide paste is a solid at room temperature, the reduction reaction can be prevented from proceeding before sintering.

Further, since a dispersant and a resin are not added into the silver oxide paste, an organic substance can be prevented from remaining on the bonding layers 25 and 35.

In addition, since the viscosity of the silver oxide paste is adjusted to 10 Pa·s or more and 100 Pa·s or less and more preferably 30 Pa·s or more and 80 Pa·s or less, in the silver oxide paste application step S24 of applying the silver oxide paste onto the second base layer 30, a screen printing method can be applied. Thus, the bonding layer 35 can be selectively formed only in the portion in which the semiconductor element 3 is provided. Thus, the amount of the used silver oxide paste can be reduced and thus the manufacturing cost of the power module 1 with a heat sink can be significantly reduced.

Further, since the viscosity of the glass-containing Ag paste is adjusted to 10 Pa·s or more and 500 Pa·s or less and more preferably 50 Pa·s or more and 300 Pa·s or less, in the glass-containing Ag paste application step S22 of applying the glass-containing Ag paste to the surface of the circuit layer 12, a screen printing method or the like can be applied and the second base layer 30 can be selectively formed in the portion in which the semiconductor element 3 is provided. Thus, the amount of the used glass-containing Ag paste can be reduced and the manufacturing cost of the power module 1 with a heat sink can be significantly reduced.

The embodiment of the present invention has been described above. However, the present invention is not limited thereto and may be appropriately modified within a range not departing from the technical idea of the present invention.

For example, in the embodiment, the case in which the heat sink (metal part) composed of A6063 (aluminum alloy) is bonded to the metal layer of the power module substrate has been described. However, the metal part may be composed of pure aluminum, a composite material including aluminum, or the like. In addition, the metal part may be composed of copper or a copper alloy and in this case, the bonding layer and the metal part can be bonded without forming the third base layer on the surface of the metal part.

The case in which the metal layer of the power module substrate and the heat sink are bonded to each other has been described. However, the metal layer may be bonded with another metal part.

Figure 10:
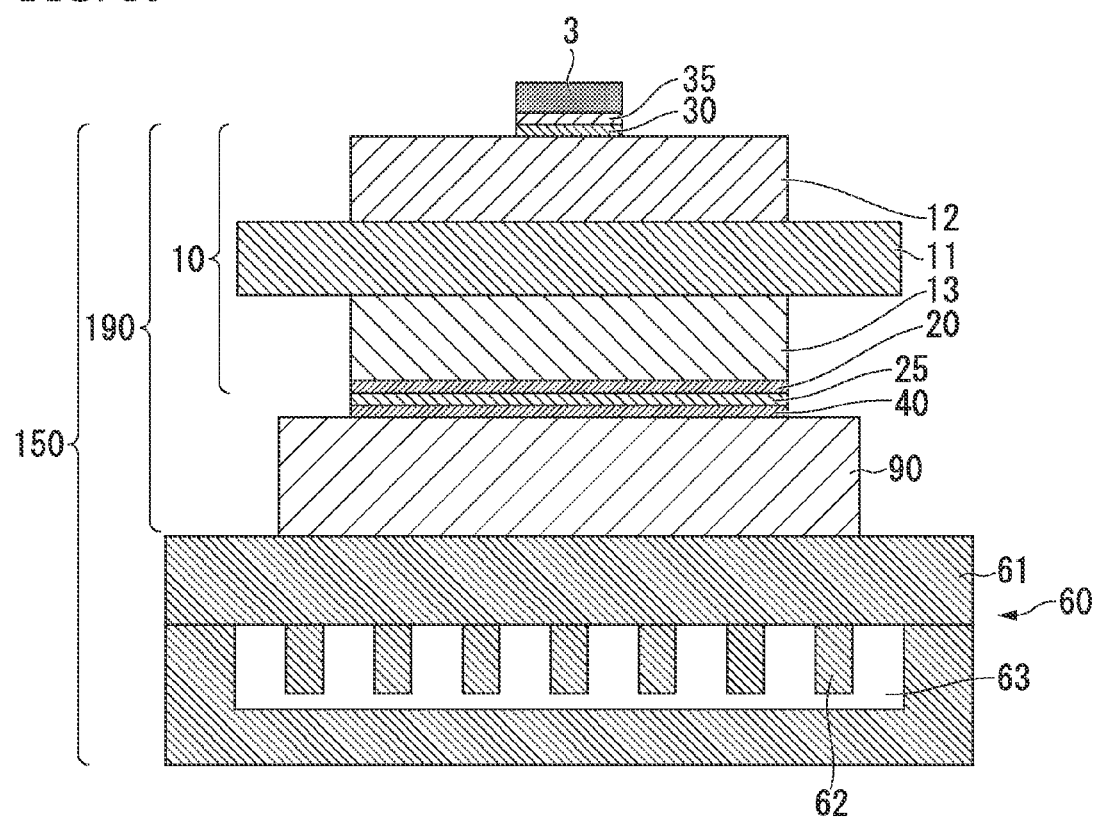
FIG. 10 is a schematic explanatory view of a power module substrate with a buffering layer.

Specifically, as shown in FIG. 10, a power module substrate 190 having a buffering layer (power module substrate with a metal part) in which the metal layer 13 of the power module substrate 10 and a buffering layer 90 (metal part) are bonded to each other may be formed.

The power module substrate 190 having a buffering layer includes the power module substrate 10 and a buffering layer 90 that is bonded to the metal layer 13 of the power module substrate 10. For example, the buffering layer 90 is composed of 4N aluminum or the like.

The third base layer 40 is formed on the surface of the buffering layer 90 and the first base layer 20 and the third base layer 40 are bonded by bonding layer 25.

The heat sink 60 is further bonded to the power module substrate 190 having a buffering layer 90 to form a power module substrate 150 with a heat sink.

The power module substrate 190 having a buffering layer and the power module substrate 150 with a heat sink also exhibit the same effects as those of the above-described embodiment. Further, since the buffering layer 90 is formed, thermal stress generated between the heat sink 60 and the metal layer 13 can be reduced.

Even in the bonding of the buffering layer 90 and the heat sink 60, the buffering layer 90 and the heat sink 60 may be bonded by forming a base layer composed of a sintered body of the glass-containing Ag paste on the surfaces of the buffering layer 90 and the heat sink 60 and further forming a bonding layer composed of a sintered body of a bonding material including at least one of metal Ag particles and Ag oxide particles.

In addition, the case in which the aluminum plate and the ceramic substrate are bonded by brazing has been described. However, there is not limitation thereto and a transient liquid phase bonding method, a casting method and the like may be applied.

Further, in the case in which the metal plate for constituting the circuit layer and the metal layer is composed of copper or a copper alloy, when the metal plate composed of copper or a copper alloy is bonded to the ceramic substrate, a direct bonding method (DSC method), an active metal brazing method, a casting method, and the like can be applied.

Further, the raw materials and the blending amount of the glass-containing Ag paste are not limited to the raw materials and the blending amount described in the embodiment. For example, a glass powder containing lead may be used.

Further, the raw materials and the blending amount of the silver oxide paste are not limited to the raw materials and the blending amount described in the embodiment. For example, a material not containing an organic metal compound may be used.

In addition, the thickness of the first glass layer, the second glass layer, and the third glass layer, the first Ag layer, the second Ag layer, and the third Ag layer in the first base layer, the second base layer, and the third base layer and the thickness of the bonding layers are not limited to the embodiment.

Further, the case in which the ceramic substrate composed of AlN is used as an insulating layer has been described. However, there is no limitation thereto and a ceramic substrate composed of $Si_3N_4$, $Al_2O_3$, and the like may be used and the insulating layer may be composed of an insulating resin.

The case in which after an aluminum plate serving as the circuit layer is bonded to the ceramic substrate, the first base layer and the second base layer are formed on the circuit layer and the metal layer has been described. However, there is no limitation thereto and the first base layer may be formed before the aluminum plate is bonded to the ceramic substrate.

In the embodiment, the case in which the first base layer and the second base layer are applied at the same time and sintered has been described. However, the first base layer and the second base layer may be separately formed.

In addition, the case in which the power module substrate and the semiconductor element and the power module substrate and the heat sink are bonded at the same time has been described. However, any of these may be bonded first.

Further, the heat sink which has a heat radiating fan and a flow passage for a cooling medium has been described. However, the structure of the heat sink is not limited thereto.

In addition, the silver oxide paste may contain Ag particles in addition to the silver oxide powder and the reducing agent. Due to the Ag particles being interposed between the silver oxide powder particles, Ag obtained by reduction of silver oxide and the Ag particles are sintered and a bonding layer having a denser structure can be formed. Accordingly, the pressure to be applied to the semiconductor element during bonding can be set to be low.

Further, an organic substance may be included in the surface of the Ag particle. In this case, the sinterability at a low temperature can be improved using the heat generated when the organic substance is decomposed.

EXAMPLES

Hereinafter, the description will be made with respect to results of confirmation experiments that have been performed to confirm the effectiveness of the present invention.

Examples

As Example 1, a power module with a heat sink described in the above-described embodiment was prepared. That is, a first base layer and a second base layer composed of a sintered body of a glass-containing Ag paste were formed on the surfaces of the metal layer and the circuit layer of the power module substrate and a third base layer was further formed on the heat sink. Then, the power module substrate and the heat sink were bonded by a bonding layer composed of a sintered body of a silver oxide paste.

As the ceramic substrate, a substrate composed of AlN and having a size of 30 mm×30 mm and a thickness of 0.635 mm was used.

In addition, as the circuit layer and the metal layer, a plate composed of 4N aluminum and having a size of 29 mm×29 mm and a thickness of 0.6 mm was used.

In Example 1, as the heat sink, a rectangular plate not having a heat radiating fan provided on the rear surface, composed of an aluminum alloy (A6063 alloy), and having a size of 60 mm×50 mm and a thickness of 5 mm was used.

In Example 2, a ceramic substrate, a metal layer, and a circuit layer were configured in the same manner as in the above-described Example 1, and as a heat sink, a rectangular plate not having a heat radiating fan provided on the rear surface, composed of pure copper, and having a size of 60 mm×50 mm and a thickness of 5 mm was used. In Example 2, the power module substrate and the heat sink were bonded by a bonding layer composed of a sintered body of a silver oxide paste without forming a third base layer on the heat sink.

At this time, as a glass powder of the glass-containing Ag paste, a glass powder including 90.6% by mass of $Bi_2O_3$, 2.6% by mass of ZnO, and 6.8% by mass of $B_2O_3$ was used. As a resin, ethyl cellulose was used and as a solvent, diethylene glycol dibutyl ether was used. Further, a dicarboxylic acid-based dispersant was added.

In addition, a commercially available silver oxide powder (manufactured by Wako Pure Chemicals Industries, Ltd.) was used as the silver oxide paste, myristyl alcohol was used as the reducing agent, and 2,2,4-trimethyl-1,3-pentanediol mono(2-methyl propanoate) was used as the solvent. A silver oxide paste obtained by mixing these components at a ratio of 80% by mass of silver oxide powder:10% by mass of reducing agent (myristyl alcohol): balance of solvent (2,2,4-trimethyl-1,3-pentanediol mono(2-methyl propanoate)) was used.

In the glass-containing Ag paste application step of applying the glass-containing Ag paste onto the surface of the circuit layer, the thickness of the applied glass-containing Ag paste was 10 μm. In addition, in the first base layer and second base layer forming step, the sintering temperature was 575° C. and the sintering time was 10 minutes.

Further, in the silver oxide paste application step of applying the silver oxide paste onto the first base layer and the third base layer, the thickness of each applied silver oxide paste was 50 μm. In the bonding layer sintering step, the sintering temperature was 300° C. and the sintering time was 2 hours. Further, the applied pressure was 3 MPa.

Comparative Example

As Comparative Example, a power module substrate obtained by forming a circuit layer on a first surface of a ceramic substrate and forming a metal layer on a second surface and a heat sink was bonded by brazing.

The ceramic substrate, the metal layer, the circuit layer, and the heat sink were configured in the same manner as in the above-described Examples. In Comparative Example, the first base layer and the third base layer were not formed.
(Evaluation)

Next, in the power module substrates with a heat sink of Examples and Comparative Example, the amount of warpage of the power module substrate, and the amount of warpage of the heat sink were evaluated.

The amount of warpage was measured by placing the power module substrate on a surface plate using a laser displacement meter. The warpage of the power module substrate was obtained by measuring the surface of the circuit layer and the warpage of the heat sink was obtained by measuring the lower surface of the heat sink.

The results of the above evaluation are shown in Table 1.

TABLE 1

| | Material of heat sink | Amount of warpage (μm) | |
|---|---|---|---|
| | | Power module substrate | Heat sink |
| Example 1 | A6063 | 110 | 140 |
| Example 2 | Pure copper | 118 | 142 |
| Comparative Example 1 | A6063 | 135 | 191 |

As shown in Table 1, in Examples, the amount of warpage of the power module substrate and the amount of warpage of the heat sink were small and satisfactory.

On the other hand, in Comparative Example, since the temperature at the time of bonding the power module substrate and the heat sink was high, the amount of warpage of the power module substrate and the amount of warpage of the heat sink were large compared to Examples.

INDUSTRIAL APPLICABILITY

According to the present invention, it is possible to provide a power module substrate capable of reducing a thermal load applied to the power module substrate and reducing warpage generated in the power module substrate and a metal part when the metal layer of the power module substrate and the metal part are bonded to each other, a power module substrate with a metal part, a power module with a metal part, a method for producing a power module substrate, and a method for producing a power module substrate with a metal part.

REFERENCE SIGNS LIST

1: Power module with a heat sink (power module with a metal part)
3: Semiconductor element
10: Power module substrate
11: Ceramic substrate
12: Circuit layer
13: Metal layer
20: First base layer
21: First glass layer
22: First Ag layer
25: Bonding layer
30: Second base layer
31: Second glass layer
32: Second Ag layer
50, 150: Power module substrate with a heat sink (power module substrate with a metal part)
60: Heat sink (metal part)
72: Glass
90: Buffering layer (metal part)
190: Power module substrate with a buffering layer (power module substrate with a metal part)

What is claimed is:
1. A power module substrate with a metal part comprising:
an insulating layer;
a circuit layer that is formed on a first surface of the insulating layer; and
a metal part that is bonded to a metal layer side of the power module substrate;
a metal layer that is formed on a second surface of the insulating layer; and
a metal part that is bonded to a metal layer side of the power module substrate, wherein
a first base layer, to which a bonding layer composed of a sintered body of a bonding material including at least one of metal particles and metal oxide particles is bonded, is laminated on a surface of the metal layer on an opposite side of the surface, to which the insulating layer is provided,
the first base layer has: a first glass layer that is formed at the interface with the metal layer, and a first Ag layer that is laminated on the first glass layer, the bonding layer that is composed of a sintered metal material is formed between the first base layer and the metal part, and the bonding layer of the power module substrate with a metal part is composed of a sintered body of a bonding material including at least one of metal Ag particles and Ag oxide particles.

2. The power module substrate according to claim 1, wherein the first base layer is composed of a sintered body of a glass-containing Ag paste containing a glass component.

3. The power module substrate according to claim 1, wherein glass is dispersed in the first Ag layer, and the area percentage of the glass exposed on the surface of the first base layer is 55% or less.

4. The power module substrate according to claim 1, wherein a second base layer is formed on the surface of the circuit layer on the opposite side of the surface, to which the insulating layer is provided, and the second base layer has: a second glass layer that is formed at the interface with the circuit layer; and a second Ag layer that is laminated on the second glass layer.

5. The power module substrate according to claim 1, wherein the insulating layer is a ceramic substrate made of a composition selected from a group consisting of AN, $Si_3N_4$, and $Al_2O_3$.

6. The power module with a metal part according to claim 1, further comprising:

a semiconductor element that is mounted on the circuit layer side of the power module substrate with a metal part.

7. A method for producing a power module substrate with a metal part including a power module substrate having a circuit layer that is formed on a first surface of an insulating layer and a metal layer that is formed on a second surface of the insulating layer, and a metal part that is bonded to the metal layer side of the power module substrate, the method comprising the steps of:

forming a first base layer, to which a bonding layer composed of a sintered body of a bonding material including at least one of metal particles and metal oxide particles is bonded, by: applying a glass-containing Ag paste containing a glass component onto a surface of the metal layer on the opposite side of the surface, to which the insulating layer is provided; and performing a heating treatment;

applying a bonding material including at least one of metal Ag particles and Ag oxide particles onto the surface of the first base layer;

laminating a metal part on the applied bonding material; and forming a bonding layer that bonds the first base layer and the metal part by heating the power module substrate and the metal part in a state in which the power module substrate and the metal part are laminated.

8. The method for producing a power module substrate with a metal part according to claim 7, wherein a sintering temperature for the bonding material in the step of forming the bonding layer is 9° C. or higher and 400° C. or lower.

9. The power module substrate according to claim 1 further comprising, a third base layer formed on the metal part, wherein the third layer comprises: a third glass layer formed at an interface with the metal part;

and a third Ag layer laminated on the third glass layer, and the bonding layer is formed between the first base layer and the third based layer.

10. The power module substrate according to claim 1, wherein the bonding layer includes both of the metal Ag particles and the Ag oxide particles.

11. The power module substrate according to claim 1, wherein the bonding layer includes the metal Ag particles and is free of the Ag oxide particles.

12. The power module substrate according to claim 1, wherein the bonding layer includes the Ag oxide particles and is free of the metal Ag particles.

13. The power module substrate according to claim 2, wherein glass is dispersed in the first Ag layer, and the area percentage of the glass exposed on the surface of the first base layer is 55% or less.

14. The method for producing a power module substrate with a metal part according to claim 7, the method further comprising the step of forming a third base layer on the metal part by applying a glass-containing Ag paste containing a glass component onto a top surface of the metal part and by performing a heating treatment before the step of laminating a metal part.

* * * * *